United States Patent
Belser et al.

(10) Patent No.: US 8,274,303 B2
(45) Date of Patent: Sep. 25, 2012

(54) SCHMITT TRIGGER WITH TEST CIRCUIT AND METHOD FOR TESTING

(75) Inventors: Mitchell A. Belser, Madison, MS (US); Eric W. Tisinger, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/871,589

(22) Filed: Aug. 30, 2010

(65) Prior Publication Data
US 2012/0049875 A1    Mar. 1, 2012

(51) Int. Cl.
*G01R 31/3187*    (2006.01)

(52) U.S. Cl. .......... 324/750.3; 324/762.09; 324/762.01; 327/205

(58) Field of Classification Search ............... 326/23; 327/205, 203
See application file for complete search history.

(56) References Cited

U.S. PATENT DOCUMENTS

| | | | |
|---|---|---|---|
| 5,450,417 A | 9/1995 | Truong et al. | |
| 5,936,448 A * | 8/1999 | Ohie et al. | 327/205 |
| 6,127,898 A * | 10/2000 | Naura | 331/57 |
| 6,140,872 A | 10/2000 | McEldowney | |
| 6,208,187 B1 | 3/2001 | Callahan, Jr. | |
| 6,549,048 B2 * | 4/2003 | Tailliet | 327/205 |
| 6,798,250 B1 * | 9/2004 | Wile | 327/51 |
| 6,870,413 B1 * | 3/2005 | Chang et al. | 327/205 |
| 7,046,014 B2 | 5/2006 | Lu | |
| 7,404,119 B2 | 7/2008 | Hsieh | |
| 7,519,486 B2 | 4/2009 | Ng et al. | |
| 2007/0216397 A1 | 9/2007 | Chan et al. | |
| 2008/0265931 A1 * | 10/2008 | Hsu et al. | 324/763 |

OTHER PUBLICATIONS

U.S. Appl. No. 12/871,597, Tisinger, E., "Comparator Circuit with Hysteresis, Test Circuit, and Method for Testing", filed Aug. 30, 2010, Office Action—Notice of Allowance, mailed Jun. 13, 2012.

* cited by examiner

*Primary Examiner* — Richard Isla Rodas
(74) *Attorney, Agent, or Firm* — Daniel D. Hill

(57) ABSTRACT

A Schmitt trigger circuit having a test circuit and method for testing are provided. The Schmitt trigger test circuit includes switches for reconfiguring the Schmitt trigger for testing by shorting the input and output terminals of an inverter and by opening a feedback path to allow the application of test voltages to the gates of feedback transistors coupled to the inverter. The method includes: directly connecting an input terminal of the inverter to an output terminal of the inverter; providing a first power supply voltage to the feedback transistors coupled to the inverter; measuring a first voltage at the input terminal; removing the first power supply voltage from the feedback transistors; providing a second power supply voltage to the feedback transistors. The test circuit and method reduce the test time by eliminating the need to ramp an input voltage while monitoring the output.

17 Claims, 4 Drawing Sheets

SCHMITT TRIGGER WITH TEST CIRCUIT AND METHOD FOR TESTING

RELATED APPLICATION

The present application is related to a commonly assigned, co-pending, U.S. patent application Ser. No. 12/871,597 by Eric Tisinger entitled, "Comparator Circuit With Hysteresis, Test Circuit, And Method For Testing", and filed concurrently herewith.

BACKGROUND

1. Field

This disclosure relates generally to Schmitt Triggers, and more specifically, to a Schmitt trigger having a test circuit and method for testing the Schmitt trigger.

2. Related Art

Schmitt trigger circuits are used in a variety of applications. A Schmitt trigger functions like a comparator with hysteresis, where the output voltage of the Schmitt trigger switches at a different input voltage depending on whether the input voltage is ramping up or ramping down. A conventional method for testing a Schmitt trigger is to simply ramp up and ramp down the input voltage while monitoring the output voltage changes. The input voltage that results in the output voltage changing when the input voltage is ramping up is the high hysteresis threshold voltage. The low hysteresis threshold voltage is determined by ramping down the input voltage until the output voltage changes. A drawback in this test method is that it requires a significant amount of time to ramp the input voltage while monitoring the output.

Therefore, what is needed is a Schmitt trigger, test circuit, and method for testing that determines the hysteresis threshold voltages more quickly.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
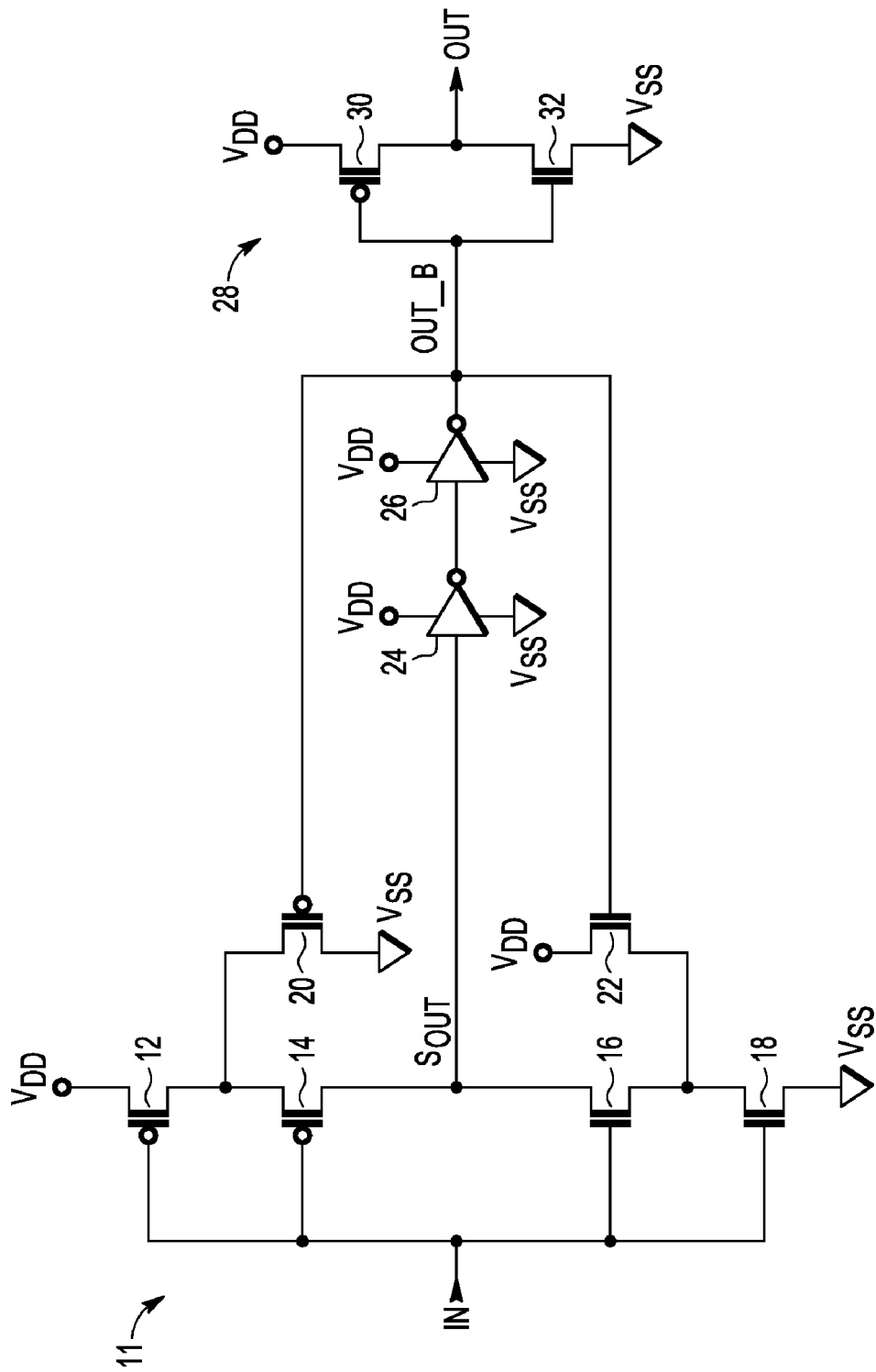
FIG. 1 illustrates, in schematic diagram form, a Schmitt trigger circuit in accordance with the prior art.

Generally, there is provided, a Schmitt trigger circuit having a test circuit for testing the high and low hysteresis switching threshold voltages without requiring the input voltage to be ramped up and down while monitoring the output voltage. The Schmitt trigger includes an inverter and feedback for establishing the hysteresis threshold voltages. When operating in a test mode, the test circuit is used to reconfigure the Schmitt trigger for testing. When operating in a normal operating mode, the test circuit does not affect Schmitt trigger operation. The test circuit includes a switch for shorting the input and output terminals of the inverter together. Also, switches are used to decouple the feedback path. The high hysteresis threshold voltage is determined by applying a power supply voltage to the feedback path while measuring the inverter input voltage. The low hysteresis threshold voltage is determined by coupling the feedback path to ground. Testing the Schmitt trigger in this manner significantly reduces the time required to determine the hysteresis switching points.

In one aspect, there is provided, in a Schmitt trigger circuit comprising an inverter coupled between first and second power supply voltage terminals, the inverter having an input terminal and an output terminal, and the Schmitt trigger circuit having a feedback transistor, a control electrode of the feedback transistor coupled to the output terminal of the inverter for receiving a feedback signal, a method for testing the Schmitt trigger circuit, the method comprising: providing a power supply voltage to the first and second power supply voltage terminals of the inverter; directly connecting the input terminal of the inverter to the output terminal of the inverter; decoupling the feedback signal from the control electrode of the feedback transistor; providing a first power supply voltage to the control electrode of the feedback transistor; measuring a first voltage at the input terminal of the inverter; removing the first power supply voltage from the gate of the feedback transistor; providing a second power supply voltage to the control electrode of the feedback transistor, wherein the second power supply voltage is different than the first power supply voltage; and measuring a second voltage at the input terminal of the inverter. Providing the first power supply voltage to the control electrode of the feedback transistor may further comprise providing a positive power supply voltage to the control electrode of the feedback transistor. Measuring the first voltage at the input terminal may further comprise measuring a first threshold voltage of the Schmitt trigger circuit, and wherein measuring the second voltage at the input terminal may further comprise measuring a second threshold voltage of the Schmitt trigger. The method may further comprise: disconnecting the direct connection of the input terminal from the output terminal; and coupling the control electrode of the feedback transistor to the output terminal of the inverter; wherein the Schmitt trigger operates in a normal operating mode. The method may further comprise: providing the first power supply voltage to the first power supply voltage terminal; and providing the second power supply voltage to the second power supply voltage terminal.

In another aspect, there is provided, in a Schmitt trigger circuit comprising a first transistor having a first current electrode coupled to a first power supply voltage terminal, a second current electrode, and a control electrode coupled to an input terminal to receive an input voltage; a second transistor having a first current electrode coupled to the second current electrode of the first transistor, a second current electrode coupled to an output terminal, and a control electrode coupled to the input terminal to receive the input voltage; a third transistor having a first current electrode coupled to the second current electrode of the second transistor at the output terminal, a second current electrode, and a control electrode coupled to the input terminal to receive the input voltage; a fourth transistor having a first current electrode coupled to the second current electrode of the third transistor, a second current electrode coupled to a second power supply voltage terminal, and a control electrode coupled to the input terminal to receive the input voltage; a fifth transistor having a first current electrode coupled to the second current electrode of the first transistor, a second current electrode coupled to the second power supply voltage terminal, and a control electrode; a sixth transistor having a first current electrode coupled to the first power supply voltage terminal, a second current electrode coupled to the second current electrode of the third transistor, and a control electrode, a method for testing the Schmitt trigger, the method comprising: directly connecting the input terminal to the output terminal; providing a first power supply voltage to the control electrodes of the fifth and sixth transistors; measuring a first voltage at the input terminal; removing the first power supply voltage from the control electrodes of the fifth and sixth transistors; providing a second power supply voltage to the control electrodes of the fifth and sixth transistors, the second power supply voltage being different than the first power supply voltage; and measuring a second voltage at the input terminal. Providing the first power supply voltage may further comprise providing a positive power supply voltage. Measuring the first voltage at the input terminal may further comprise measuring a first threshold voltage of the Schmitt trigger circuit, and wherein measuring the second voltage at the input terminal further comprises measuring a second threshold voltage of the Schmitt trigger. The method may further comprise: disconnecting the direct connection of the input terminal from the output terminal; and coupling the control electrodes of the fifth and sixth transistors to the output terminal, wherein the Schmitt trigger operates in a normal operating mode. The method may further comprise: providing the first power supply voltage to the first power supply voltage terminal; and providing the second power supply voltage to the second power supply voltage terminal. Providing the first power supply voltage may further comprise providing a positive power supply voltage to the first power supply voltage terminal, and wherein providing the second power supply voltage to the second power supply voltage terminal may further comprise coupling the second power supply voltage terminal to ground.

In yet another aspect, there is provided, a Schmitt trigger circuit comprising: a first transistor having a first current electrode coupled to a first power supply voltage terminal, a second current electrode, and a control electrode coupled to an input terminal for receiving an input voltage; a second transistor having a first current electrode coupled to the second current electrode of the first transistor, a second current electrode coupled to a circuit node, and a control electrode coupled to the input terminal to receive the input voltage; a third transistor having a first current electrode coupled to the second current electrode of the second transistor at the circuit node, a second current electrode, and a control electrode coupled to the input terminal to receive the input voltage; a fourth transistor having a first current electrode coupled to the second current electrode of the third transistor, a second current electrode coupled to a second power supply voltage terminal, and a control electrode coupled to the input terminal to receive the input voltage; a fifth transistor having a first current electrode coupled to the second current electrode of the first transistor, a second current electrode coupled to the second power supply voltage terminal, and a control electrode coupled to the circuit node; a sixth transistor having a first current electrode coupled to the first power supply voltage terminal, a second current electrode coupled to the second current electrode of the third transistor, and a control electrode coupled to the circuit node; and a test circuit for selectively directly connecting the input terminal to the circuit node, the test circuit for selectively decoupling the control electrodes of the fifth and sixth transistors from the circuit node, and the test circuit for selectively applying the first and second power supply voltages to the control electrodes of the fifth and sixth transistors. The first second, and fifth transistors may be characterized as being P-channel transistors, and the third, fourth and sixth transistors may be characterized as being N-channel transistors. The first power supply voltage terminal may be coupled to receive a positive power supply voltage, and wherein the second power supply voltage terminal may be coupled to ground. The Schmitt trigger circuit may further comprise an inverter having an input terminal coupled to the circuit node, and an output terminal. The Schmitt trigger circuit may further comprise a plurality of series-connected inverters coupled to the circuit node. The Schmitt trigger may be implemented on a single integrated circuit. The test circuit may comprise: a first switch having a first terminal coupled to the input terminal, and a second terminal coupled to the circuit node; a second switch having a first terminal coupled to the control electrode of the fifth transistor, and a second terminal coupled to the circuit node; and a third switch having a first terminal coupled to the control electrode of the sixth transistor, and a second terminal coupled to the circuit node.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

Each signal described herein may be designed as positive or negative logic, where negative logic can be indicated by a bar over the signal name or a letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in schematic diagram form, Schmitt trigger circuit 10 in accordance with the prior art. Schmitt trigger 10 is implemented on an integrated circuit using a conventional complementary metal-oxide semiconductor (CMOS) manufacturing process technology. Schmitt trigger 10 includes inverters 11, 24, 26, and 28 connected in series. Some or all of inverters 24, 26, and 28 may not be needed in some embodiments. Inverter 11 includes P-channel transistors 12 and 14 and N-channel transistors 16 and 18. Feedback transistors 20 and 22 provide a feedback path for inverter 11. Inverter 28 includes P-channel transistor 30 and N-channel transistor 32. The circuit is supplied using a positive power supply voltage labeled "VDD" and a ground power supply terminal labeled "VSS". In another embodiment, a different power supply voltage may be used.

P-channel transistor 12 has a first current electrode (source) connected to VDD, a second current electrode (drain), and a control electrode (gate) coupled to receive an input voltage labeled "IN". P-channel transistor 14 has a first current electrode connected to the second current electrode of transistor 12, a second current electrode connected to a node labeled "SOUT", and a control electrode connected to the control electrode of transistor 12. N-channel transistor 16 has a first current electrode connected to the second current electrode of transistor 14 at node SOUT, a second current electrode, and a control electrode connected to the control electrode of transistor 12. N-channel transistor 18 has a first current electrode connected to the second current electrode of transistor 16, a second current electrode connected to VSS, and a control electrode connected to the control electrode of transistor 12. Inverter 24 has an input terminal connected to node SOUT, and an output terminal. Inverter 26 has an input terminal connected to the output terminal of inverter 24, and an output terminal labeled "OUT_B". P-channel feedback transistor 20 has a first current electrode connected to the second current electrode of transistor 12, a second current electrode connected to VSS, and a control electrode connected to the output terminal of inverter 26. N-channel feedback transistor 22 has a first current electrode connected to VDD, a second current electrode connected to the second current electrode of transistor 16, and a control electrode connected to the output terminal of inverter 26. P-channel transistor 30 has a first current electrode connected to VDD, a second current electrode connected to an output terminal labeled "OUT", and a control terminal connected to the output terminal of inverter 26. N-channel transistor 32 has a first current electrode connected to the second current electrode of P-channel transistor 30 at output terminal OUT, a second current electrode connected to VSS, and a control electrode connected to the output terminal of inverter 26.

In operation, positive feedback through feedback transistors 20 and 22 is used to control the hysteresis threshold voltages. When input voltage IN is stable at a logic low voltage, transistors 12 and 14 are conductive while transistors 16 and 18 are substantially non-conductive. The voltage at node SOUT is a logic high. Inverters 24 and 26 provide a logic high feedback signal to feedback transistors 20 and 22. Feedback transistor 20 is substantially non-conductive and feedback transistor 22 is conductive. When the input voltage IN transitions from a logic low to a logic high, transistors 12 and 14 begin to turn off and transistors 16 and 18 begin to turn on. As the input voltage increases, the voltage at node SOUT transitions to a logic low. The voltage at which this happens is delayed because N-channel transistor 22 is on and supplying a high voltage to the node between transistors 16 and 18. When the voltage at node SOUT finally transitions to a logic low, inverters 24 and 26 will switch states, so that a logic low is provided to feedback transistors 20 and 22. The logic low feedback voltage causes P-channel transistor 20 to be conductive and N-channel transistor 22 to be substantially non-conductive. When input voltage IN transitions back to a logic low, P-channel transistor 20 is pulling the node between transistors 12 and 14 low, so that the transition of SOUT is delayed.

In the illustrated embodiment, series-connected inverters 24 and 26 function to buffer voltage SOUT. In another embodiment, inverters 24 and 26 may not be needed. Also, in another embodiment, there may be more than two series-connected inverters.

Figure 2:
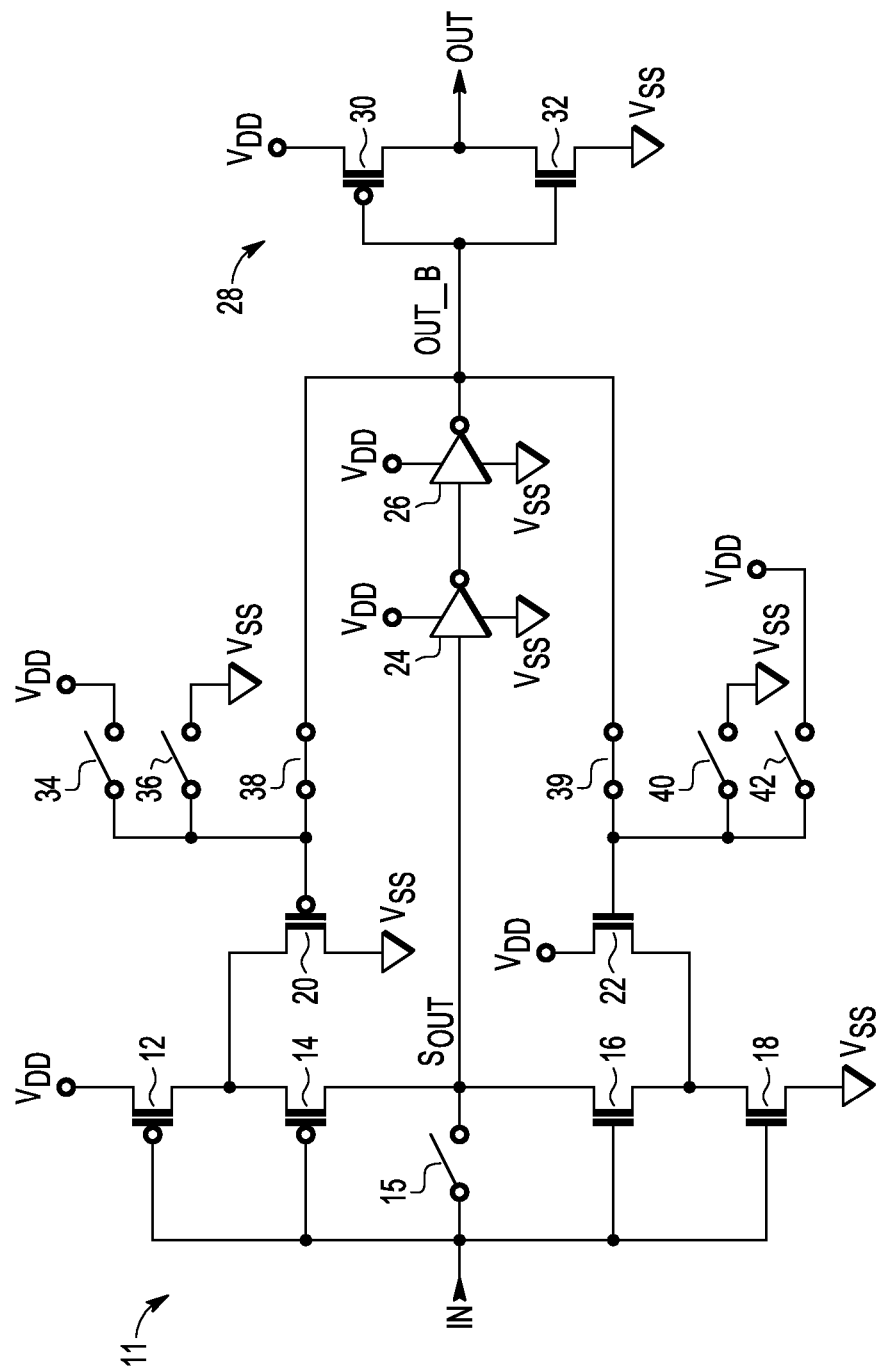
FIG. 2 illustrates, in schematic diagram form, a Schmitt trigger circuit configured for normal operation in accordance with an embodiment.

FIG. 2 illustrates, in schematic diagram form, Schmitt trigger circuit 10' configured for normal operation in accordance with an embodiment. Generally, Schmitt trigger circuit 10' includes all of the elements of Schmitt trigger circuit 10. In addition, Schmitt trigger circuit 10' has a test circuit including switches 15, 34, 36, 38, 39, 40, and 42. Switches 15, 34, 36, 38, 39, 40, and 42 are responsive to one or more test signals (not shown). In another embodiment, switches 15, 34, 36, 38, 39, 40, and 42 may be implemented with one or more transistors, transmission gates, logic circuits, or multiplexers, or a combination of circuit elements. Switch 15 has a first terminal connected to the gates of transistors 12, 14, 16, and 18, and an output terminal connected to node SOUT. Switch 34 has a first terminal connected to the gate of transistor 20, and a second terminal coupled to receive power supply voltage VDD. Switch 36 has a first terminal connected to the gate of transistor 20, and a second terminal coupled to ground. Switch 38 has a first terminal connected to the gate of transistor 20, and a second terminal connected to the output terminal of inverter 26. Switch 39 has a first terminal connected to the gate of transistor 22, and a second terminal connected to the output terminal of inverter 26. Switch 40 has a first terminal connected to the gate of transistor 22, and a second terminal coupled to ground. Switch 42 has a first terminal connected to the gate of transistor 22, and a second terminal coupled to receive power supply voltage VDD.

As illustrated in FIG. 2, Schmitt trigger circuit 10' is configured in a normal operating mode by opening switches 15, 34, 36, 40, and 42 and closing switches 38 and 39. In the normal operating mode, Schmitt trigger circuit 10' operates as described above regarding Schmitt trigger 10 in FIG. 1. The addition of the switches provides little or no impact on the operation of Schmitt trigger circuit 10' when operating in the normal mode.

Figure 3:
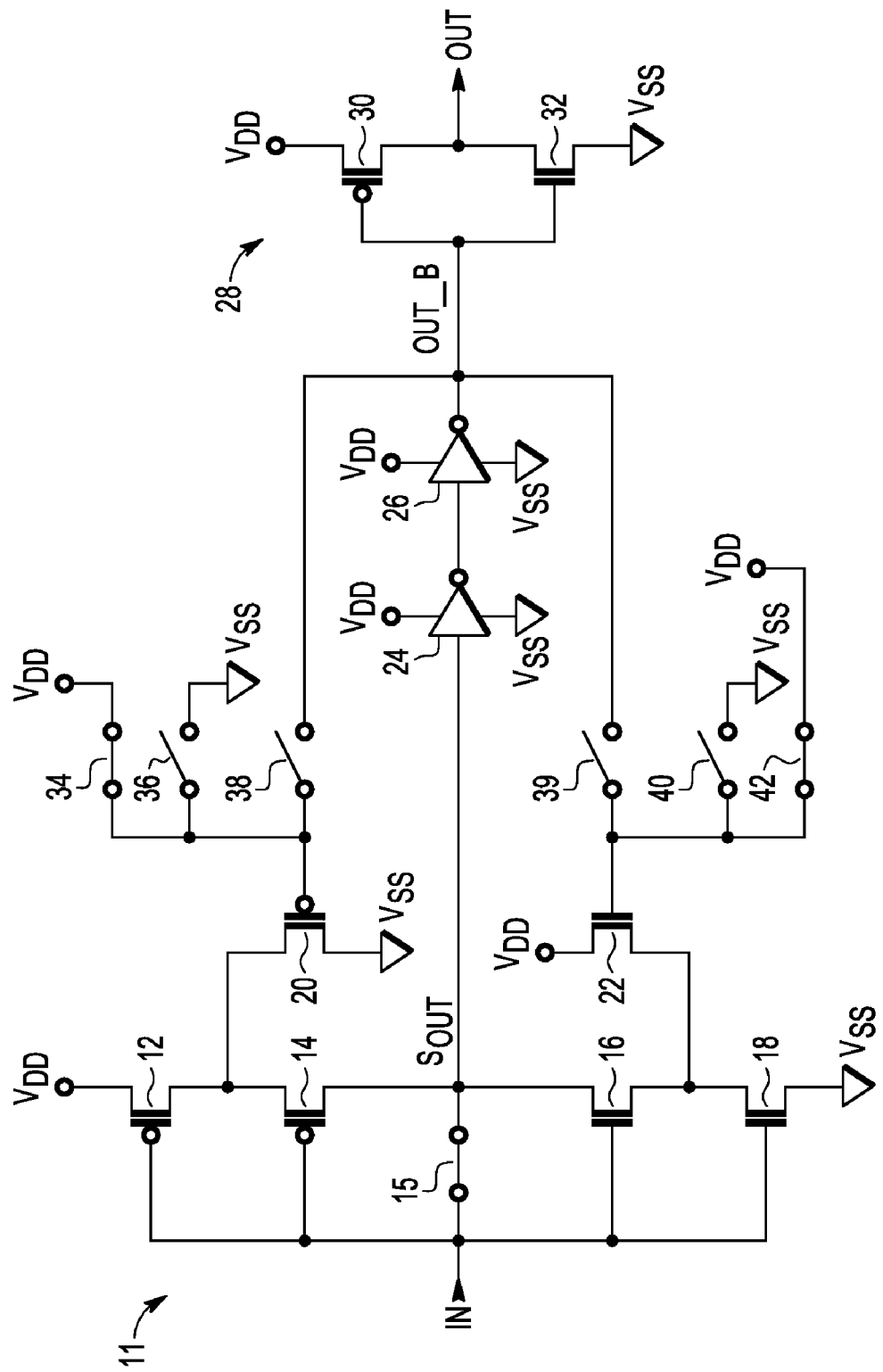
FIG. 3 illustrates the Schmitt trigger circuit of FIG. 2 configured for high hysteresis threshold voltage testing.

FIG. 3 illustrates Schmitt trigger circuit 10' of FIG. 2 configured for testing the high hysteresis threshold voltage. To test the high hysteresis threshold voltage, switches 15, 34, and 42 are closed, and switches 36, 38, 39, and 40 are open. The power supply voltage VDD is provided to Schmitt trigger 10'. The closed switch 15 shorts the input and output terminals of inverter 11. The open switches 38 and 39 interrupt the feedback path between the output of inverter 26 and the gates of feedback transistors 20 and 22. The high hysteresis threshold voltage is measured at nodes IN or SOUT (because they are connected together) while power supply voltage VDD is applied to the gates of transistors 20 and 22. Note that in other embodiments, the hysteresis voltages may be measured at another point, such as for example, output OUT or OUT_B.

Figure 4:
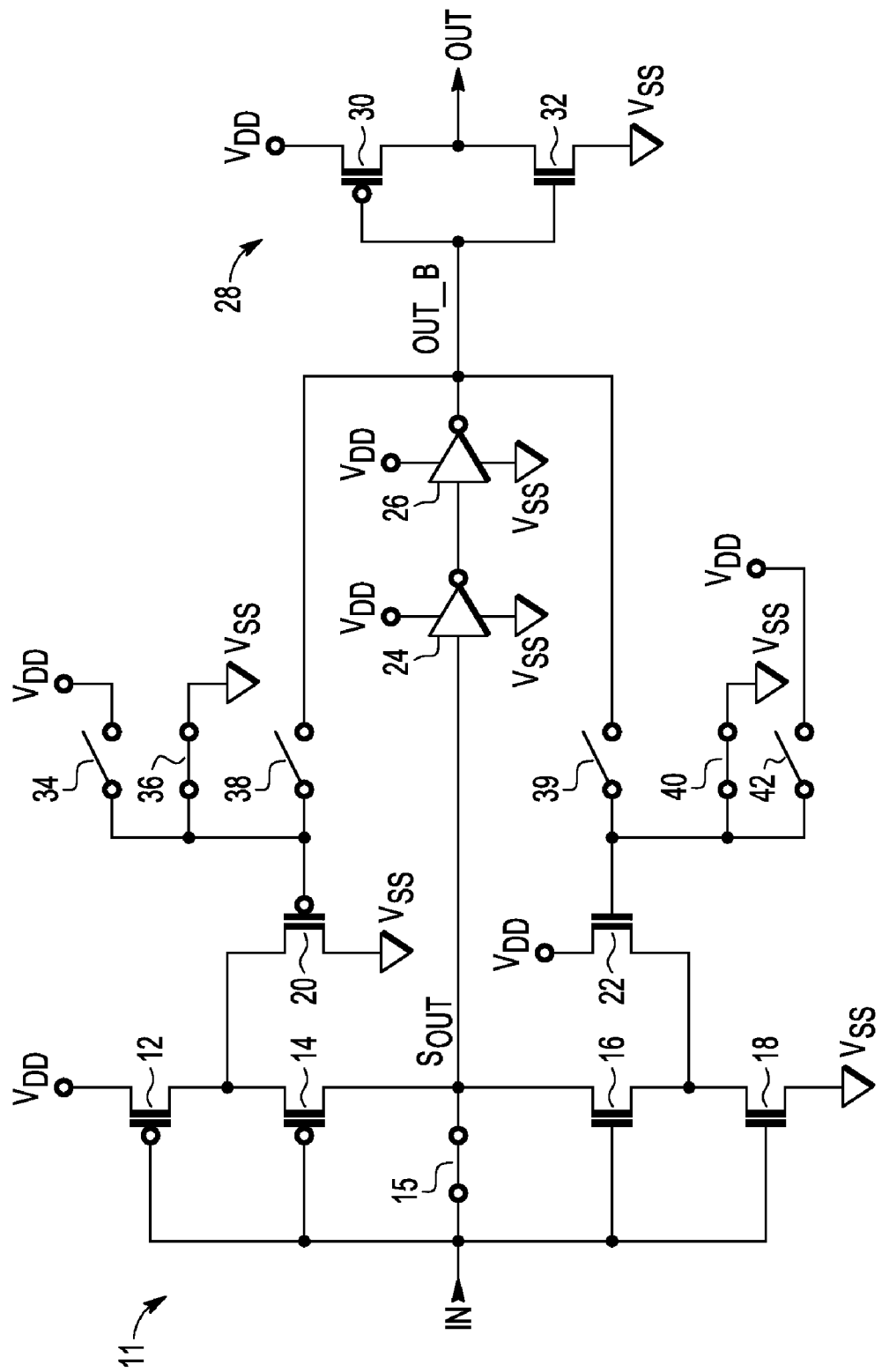
FIG. 4 illustrates the Schmitt trigger circuit of FIG. 2 configured for low hysteresis threshold voltage testing.

FIG. 4 illustrates Schmitt trigger circuit 10' of FIG. 2 configured for testing the low hysteresis threshold voltage. To test the low hysteresis threshold voltage, switches 15, 36, and 40 are closed, and switches 34, 38, 39, and 42 are open. The power supply voltage VDD is provided to the circuit. The closed switch 15 shorts the input and output terminals of inverter 11. The open switches 38 and 39 interrupt the feedback path between the output of inverter 26 and the gates of transistors 20 and 22. The low threshold voltage is measured at node IN or SOUT because they are connected together) while power supply voltage VSS is applied to the gates of transistors 20 and 22. Note that in other embodiments, the hysteresis voltages may be measured at another point, such as for example, output OUT or OUT_B.

Note that the Schmitt trigger output signal OUT is invalid during the test mode, and may be disabled in another embodiment to prevent a circuit coupled to output signal OUT from responding to the output signal OUT. Also, the illustrated Schmitt trigger includes differential feedback using transistors 20 and 22. In another embodiment, Schmitt trigger 10' may use single-ended feedback.

The test circuitry and the method for testing allow the threshold voltages of the Schmitt trigger to be measured at the input without ramping voltages at the input and monitoring the output. Testing in this manner reduces the amount of time required to test Schmitt trigger circuit 10'.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. In a Schmitt trigger circuit comprising an inverter coupled between first and second power supply voltage terminals, the inverter having an input terminal and an output terminal, and the Schmitt trigger circuit having a feedback transistor, a control electrode of the feedback transistor coupled to the output terminal of the inverter for receiving a feedback signal, a method for testing a high hysteresis threshold voltage and a low hysteresis threshold voltage of the Schmitt trigger circuit, the method comprising:
   providing a power supply voltage to the first and second power supply voltage terminals of the inverter;
   directly connecting the input terminal of the inverter to the output terminal of the inverter;
   decoupling the feedback signal from the control electrode of the feedback transistor;
   providing a first power supply voltage to the control electrode of the feedback transistor;
   measuring a first voltage at the input terminal of the inverter, wherein the first voltage corresponds to the high hysteresis threshold voltage;
   removing the first power supply voltage from the gate of the feedback transistor;
   providing a second power supply voltage to the control electrode of the feedback transistor, wherein the second power supply voltage is different than the first power supply voltage; and
   measuring a second voltage at the input terminal of the inverter, wherein the second voltage corresponds to the low hysteresis threshold voltage.

2. The method of claim 1, wherein providing the first power supply voltage to the control electrode of the feedback transistor further comprises providing a positive power supply voltage to the control electrode of the feedback transistor.

3. The method of claim 1, further comprising:
   disconnecting the direct connection of the input terminal from the output terminal; and
   coupling the control electrode of the feedback transistor to the output terminal of the inverter;
   wherein the Schmitt trigger operates in a normal operating mode.

4. The method of claim 1, further comprising:
   providing the first power supply voltage to the first power supply voltage terminal; and
   providing the second power supply voltage to the second power supply voltage terminal.

5. In a Schmitt trigger circuit comprising a first transistor having a first current electrode coupled to a first power supply voltage terminal, a second current electrode, and a control electrode coupled to an input terminal to receive an input voltage; a second transistor having a first current electrode coupled to the second current electrode of the first transistor, a second current electrode coupled to an output terminal, and a control electrode coupled to the input terminal to receive the input voltage; a third transistor having a first current electrode coupled to the second current electrode of the second transistor at the output terminal, a second current electrode, and a control electrode coupled to the input terminal to receive the input voltage; a fourth transistor having a first current electrode coupled to the second current electrode of the third transistor, a second current electrode coupled to a second power supply voltage terminal, and a control electrode coupled to the input terminal to receive the input voltage; a fifth transistor having a first current electrode coupled to the second current electrode of the first transistor, a second current electrode coupled to the second power supply voltage terminal, and a control electrode; a sixth transistor having a first current electrode coupled to the first power supply voltage terminal, a second current electrode coupled to the second current electrode of the third transistor, and a control electrode, a method for testing a high hysteresis threshold voltage and a low hysteresis threshold voltage of the Schmitt trigger, the method comprising:
   directly connecting the input terminal to the output terminal;
   providing a first power supply voltage to the control electrodes of the fifth and sixth transistors;
   measuring a first voltage at the input terminal, wherein the first voltage corresponds to the high hysteresis threshold voltage;
   removing the first power supply voltage from the control electrodes of the fifth and sixth transistors;
   providing a second power supply voltage to the control electrodes of the fifth and sixth transistors, the second power supply voltage being different than the first power supply voltage; and
   measuring a second voltage at the input terminal, wherein the second voltage corresponds to the low hysteresis threshold voltage.

6. The method of claim 5, wherein providing the first power supply voltage further comprises providing a positive power supply voltage.

7. The method of claim 5, further comprising:
   disconnecting the direct connection of the input terminal from the output terminal; and
   coupling the control electrodes of the fifth and sixth transistors to the output terminal, wherein the Schmitt trigger operates in a normal operating mode.

8. The method of claim 5, further comprising:
   providing the first power supply voltage to the first power supply voltage terminal; and providing the second power supply voltage to the second power supply voltage terminal.

9. The method of claim 8, wherein providing the first power supply voltage further comprises providing a positive power supply voltage to the first power supply voltage terminal, and wherein providing the second power supply voltage to the second power supply voltage terminal further comprises coupling the second power supply voltage terminal to ground.

10. A Schmitt trigger circuit comprising:
- a first transistor having a first current electrode coupled to a first power supply voltage terminal, a second current electrode, and a control electrode coupled to an input terminal for receiving an input voltage;
- a second transistor having a first current electrode coupled to the second current electrode of the first transistor, a second current electrode coupled to a circuit node, and a control electrode coupled to the input terminal to receive the input voltage;
- a third transistor having a first current electrode coupled to the second current electrode of the second transistor at the circuit node, a second current electrode, and a control electrode coupled to the input terminal to receive the input voltage;
- a fourth transistor having a first current electrode coupled to the second current electrode of the third transistor, a second current electrode coupled to a second power supply voltage terminal, and a control electrode coupled to the input terminal to receive the input voltage;
- a fifth transistor having a first current electrode coupled to the second current electrode of the first transistor, a second current electrode coupled to the second power supply voltage terminal, and a control electrode coupled to the circuit node; and
- a test circuit for selectively directly connecting the input terminal to the circuit node, the test circuit for selectively decoupling the control electrode of the fifth transistor from the circuit node, and the test circuit for selectively applying the first and second power supply voltages to the control electrode of the fifth transistor.

11. The Schmitt trigger circuit of claim 10, wherein the first power supply voltage terminal is coupled to receive a positive power supply voltage, and wherein the second power supply voltage terminal is coupled to ground.

12. The Schmitt trigger circuit of claim 10, further comprising an inverter having an input terminal coupled to the circuit node, and an output terminal.

13. The Schmitt trigger circuit of claim 10, further comprising a plurality of series-connected inverters coupled to the circuit node.

14. The Schmitt trigger of claim 10, wherein the Schmitt trigger is implemented on a single integrated circuit.

15. The Schmitt trigger circuit of claim 10, wherein the first, second, and fifth transistors are characterized as being P-channel transistors, and the third and fourth transistors are characterized as being N-channel transistors.

16. The Schmitt trigger circuit of claim 10, further comprising a sixth transistor having a first current electrode coupled to the first power supply voltage terminal, a second current electrode coupled to the second current electrode of the third transistor, and a control electrode coupled to the circuit node.

17. The Schmitt trigger of claim 16, wherein the test circuit comprises:
- a first switch having a first terminal coupled to the input terminal, and a second terminal coupled to the circuit node;
- a second switch having a first terminal coupled to the control electrode of the fifth transistor, and a second terminal coupled to the circuit node; and
- a third switch having a first terminal coupled to the control electrode of the sixth transistor, and a second terminal coupled to the circuit node.

* * * * *